United States Patent
Desu et al.

[11] Patent Number: 5,817,170
[45] Date of Patent: Oct. 6, 1998

[54] LOW TEMPERATURE SEEDING PROCESS FOR FERROELECTRIC MEMORY DEVICE

[75] Inventors: Seshu B. Desu, Blacksburg, Va.; Chi Kong Kwok, Fremont, Calif.

[73] Assignees: Ceram Incorporated; Sharp Kabushiki Kaisha; Virginia Tech Intellectual Properties, Inc.

[21] Appl. No.: 298,344

[22] Filed: Aug. 29, 1994

Related U.S. Application Data

[63] Continuation-in-part of Ser. No. 80,672, Jun. 22, 1993, abandoned.

[51] Int. Cl.[6] ............................................ C30B 25/06
[52] U.S. Cl. ........................... 117/2; 117/84; 427/419.2; 427/126.3
[58] Field of Search ........................... 117/2, 84, 105; 427/126.2, 126.3, 226, 419.2, 419.3; 437/230; 505/734

[56] References Cited

U.S. PATENT DOCUMENTS

| | | | |
|---|---|---|---|
| 4,844,727 | 7/1989 | Ohya et al. | 501/134 |
| 5,198,269 | 3/1993 | Swartz et al. | 427/226 |
| 5,431,958 | 7/1995 | Desu et al. | 427/255.3 |

*Primary Examiner*—Felisa C. Garrett
*Attorney, Agent, or Firm*—Davis, Graham & Stubbs, L.L.C.

[57] ABSTRACT

A process for producing a ferroelectric lead zirconate titanate dielectric for a semiconductor device by applying a lead titanate seeding layer to a substrate before applying the lead zirconate titanate film, and a semiconductor device produced in accordance with the process. The lead titanate seeding layer allows the subsequent lead zirconate titanate to be annealed at a significantly lower seeding temperature, to lessen interdiffusion among the films, electrodes and substrate and to lessen thermal stresses.

8 Claims, 5 Drawing Sheets

LOW TEMPERATURE SEEDING PROCESS FOR FERROELECTRIC MEMORY DEVICE

This is a continuation-in-part for application No. Ser. No. 08/080672, filed Jun. 22, 1993, now abandoned.

This invention was made with Government support under Grant N00014-90-J-1957 awarded by the Department of the Navy. The government has certain rights in the invention.

FIELD OF THE INVENTION

The present invention relates to the field of producing semiconductor devices and, in particular, to a method and system for low temperature perovskite formation of lead zirconate titanate ("PZT") by a seeding process and a capping process for use in semiconductor devices such as a dynamic random access memory, and a semiconductor device produced in accordance with such a process.

BACKGROUND OF THE INVENTION

Semiconductor devices such as a dynamic and nonvolatile random access memory ("DRAM") have decreased in size and increased in capacity dramatically over the last 20 years. As the capacity of memory cells has increased and the size has decreased, the design of the cells has become increasingly complex in order to preserve sufficient electrical capacitance to hold the electrical charge representing the stored data.

In the past silicone dioxide has been used as the dielectric in the capacitors of DRAM cells. However, silicone dioxide has a relatively low dielectric constant of about four. There has recently been experimentation with the use of other dielectric materials in order to increase the electrical capacitance in very small and complex cells. Some of this work has focused on the use of ferroelectric materials such as a solid solution of PZT as the dielectric in the capacitor. The relaxation properties of the PZT ferroelectric material produce an increase in the capacitance that is beyond what the dielectric constant would indicate. An example of such an approach is described in U.S. Pat. No. 5,109,357 by Eaton.

According to the phase diagram of PZT (E. Sawaguchi, J. Phys. Soc. Jpn. 8, 615 (1953)), the boundary between the ferroelectric and antiferroelectric phase is approximately 6 mole % of Ti. Any composition of PZT with Ti content higher than 6% is in the ferroelectric region. A commonly used PZT composition contains about 53 mole % Zr and 47 mole % Ti (53/47), which is located at the morphotropic phase boundary. Preliminary study has shown that ferroelectric films of composition close to MPB composition (from Zr/Ti ratio of 40/60 to 65/35) possess very good ferroelectric properties required for fast and reliable memory switching.

One of the obstacles to integrating PZT films into the existing semiconductor processes is the high temperature post-deposition annealing needed to form the desirable perovskite phase. This annealing is required because most of the as-deposited films are amorphous, and they form an intermediate nonferroelectric pyrochlore phase before the formation of the perovskite phase. The transformation temperatures for initial perovskite formation ($T_i^{per}$) and complete perovskite formation ($T_c^{per}$) of the PZT films are functions of the compositions and the type of substrate used for deposition. Typical annealing temperatures for 53/47 films vary from 650° C. to 750° C. At these annealing temperatures, interdiffusion among the PZT films, the contact electrodes, and the underlying metallization becomes a concern; furthermore, thermal stress developed during the high temperature annealing may affect the long-term reliability of the device. Therefore, there is a need for a novel process of thin film deposition which requires a lower perovskite transformation temperature.

It has been reported qualitatively that the perovskite transformation is nucleation controlled (K. Chen and J. Mackenzie, in Better Ceramics Through Chemistry IV, edited by B. J. J. Zelinsky, C. J. Brinker, D. E. Clark, and D. R. Ulrich (Mater. Res. Soc. Symp. Proces. 180, Pittsburgh, Pa., 1990), p. 663). The nucleation and growth of the perovskite phase has been studied by scanning electron microscopy ("SEM") (C. Kwok and S. Desu, Ceramic Transactions: Ferroelectric Films, edited by A. Bhalla (Am. Ceram Soc. Westerville, Ohio, 1992), Vol. 25, p. 73) which showed that the activation energies of the nucleation and growth of the 53/47 PZT perovskite phase are 441 kJ/mole and 112 kJ/mole, respectively. A separate kinetics study of PZT perovskite transformation by an optical method also indicated that the activation energy of nucleation is much higher than that of growth of the perovskite phase (C. Peng and S. Desu, in Ferroelectric Thin Films II, edited by A. I. Kingon, E. R. Myers, and B. Tuttle (Mater. Res. Soc. Symp. Proc. 243, Pittsburgh, Pa., 1992), p. 335). Therefore, the transformation from the pyrochlore phase to the perovskite phase is clearly nucleation controlled. Since nucleation is the rate-limiting step of the phase transformation, the transformation kinetics can be expedited when numerous nucleation sites are created on the substrate. The underlying principle of the two-step process of the present invention is to provide a large number of such favorable nucleation sites by the seeding layer.

Seeding processes have been demonstrated to enhance the kinetics of crystallization of gel particles (M. Kimagai and G. Messing, J. Am. Ceram. Soc. 67 (11), C230 (1984)) and to encourage the formation of epitaxial film (K. Miller and F. Lange, J. Mater. Res. 6, 2387 (1991)). There appears not to be any published results of lowering PZT perovskite transformation temperature using a seeding process, however.

It has been shown that PZT loses its Pb content during the post-deposition annealing. The loss of Pb in PZT will prevent the complete formation of perovskite phase in the film. Therefore, the present invention provides a solution to solve this problem by depositing a thin layer of PbO film on the top of PZT film before the post-deposition annealing. This thin layer of PbO film will compensate the loss of Pb from PZT film during the post-deposition annealing. Thus, the complete formation of perovskite phase of PZT film is assured by the PbO capping layer.

SUMMARY OF THE INVENTION

The present invention is a seeding process and a capping process for low temperature perovskite transformation of a PZT ferroelectric, and a semiconductor device produced in accordance with that process. Lead titanate ("PT") is deposited on a substrate, and then baked and annealed. Onto the PT layer is applied a 53/47 PZT thin film, to produce a PT-PZT film, which is then baked. A thin layer of PbO film is then applied onto the PT-PZT film to form a structure of PT-PZT-PbO, which is then baked and annealed. The PT film produces a seeding layer which allows pyrochlore-to-perovskite phase transformation temperature to be reduced by as much as 100° C. The top PbO layer prevents the Pb loss from the PZT film and assures a complete formation of perovskite phase.

The present invention includes a three-step process which utilizes the seeding to produce ferroelectric films at low transformation temperatures and the capping to prevent ferroelectric films from losing its volatile elements. This process can be, in principle, applied to other materials systems that undergo a similar polymorphic phase transformation.

DETAILED DESCRIPTION OF THE INVENTION

Figure 1:
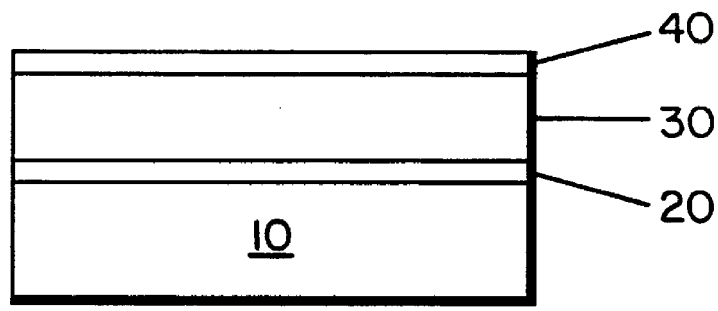
FIG. 1 is a schematic diagram of the present invention.

In the preferred embodiment of the present invention, PZT thin films are fabricated from sol-gel precursors (0.04M) of lead acetate, titanium isopropoxide, and zirconium n-propoxide dissolved in glacial acetic acid and n-propanol in accordance with processes known in the art. The proper amounts of Zr and Ti alkoxides were premixed in the presence of propanol and acetic acid before the addition of lead acetate. Ten mole % extra Pb was used in preparing the solution. These solutions were hydrolyzed with an appropriate amount of water and were further diluted with propanol and acetic acid to form the solution used for deposition. The details of the precursor preparation are similar to the process suggested in G. Yi and M. Sayer, Ceram. Bull. 70 (7), 1173 (1991). Seven sols with different Zr/Ti stoichiometries were prepared. The Zr/Ti ratios investigated were 0/100, 30/70, 40/60, 53/47, 65/35, 75/25, and 100/0%. The compositions of the films made by these precursors were characterized by an electron microprobe. The compositions of all the films prepared by the sol-gel method were within 1 at. % of their target compositions.

Thin films were deposited by spin coating the solution on single crystal sapphire substrates. The thickness of the film was controlled by the spin speed and the concentration of the precursor. After spin coating, the film was placed on a hot plate and the organic solvents were baked out at 150° C. for 5 minutes. Film thickness can be increased by repeating the spin coating and baking process steps. Final annealing was performed in a tube furnace in air at various annealing temperatures.

In the three step process of the present invention, the first step is to deposit a very thin layer of (0.4M) lead titanate (PT) onto a sapphire substrate. The spin speed used was 9000 rpm for 30 s. The film was then baked at 150° C. for 5 minutes and annealed at 500° C. for 15 minutes in air. Final PT film thickness was about 45 nm. At this stage, the PT film had already transformed into the perovskite structure. It is anticipated that a thinner seeding film—for instance, a few atomic layer thick film—would still be effective.

The second step includes depositing the PZT film with desired composition and thickness onto the PT-coated substrate. In the preferred embodiment, a Zr/Ti composition of 53/47 and thickness of 300 nm were chosen based on previous experiments which have shown that PZT films having this combination produce very good ferroelectric properties. PZT films were obtained by spinning and baking twice, for which a spin speed of 1500 rpm was used.

The third step is to deposit a very thin layer of PbO film onto the PZT film. The thickness of PbO film can be varied from 2 nm to 20 nm. The sample is then baked at 150° C. for 5 minutes. Final annealings were performed in a tube furnace at annealing temperatures ranging from 500° C. to 750° C. These films were then characterized by x-ray diffraction, scanning electron, and optical microscopy.

In most of the thin film deposition techniques, such as the sol-gel method, metalorganic decomposition (MOD), and sputtering, as-deposited PZT films generally have amorphous structures. Post-deposition annealing is needed to produce the desirable ferroelectric perovskite phase. The amorphous structure first transforms into perovskite phase at a higher annealing temperature. The pyrochlore phase has an oxygen-deficient fluorite structure and it is non-ferroelectric. The details of the pyrochlore-to-perovskite transformation have been studied by transmission electron microscopy, as reported in Ceramic Transactions: Ferroelectric Films, C. Kwok and S. Desu, (Am. Ceram. Soc., Westerville, Ohio, 1992), Vol. 25, p. 85. The transformation of the pyrochlore phase to the perovskite phase can be monitored by x-ray diffraction. For the 53/47 PZT films, the perovskite phase has sharp and well-defined major peaks at $2\theta$ of 31.3°, 38° and 55.5°. The pyrochlore phase has very broad major peaks at $2\theta$ of 29.5°, 34.2°, and 49.2°.

FIG. 1 is a schematic diagram of this invention. A seeding layer (20) is deposited into a substrate (10), ferroelectric film (30) is deposited onto the seeding layer, and a capping layer (40) is deposited on the top of the ferroelectric film. The substrate 10 is sapphire for the following experimental data. However, it can be electrode-coated silicon wafers or any suitable substrates. The seeding layer is lead titanate, the ferroelectric film is lead zirconate titanate, and the capping layer is lead oxide for the following experimental data.

Figure 2:
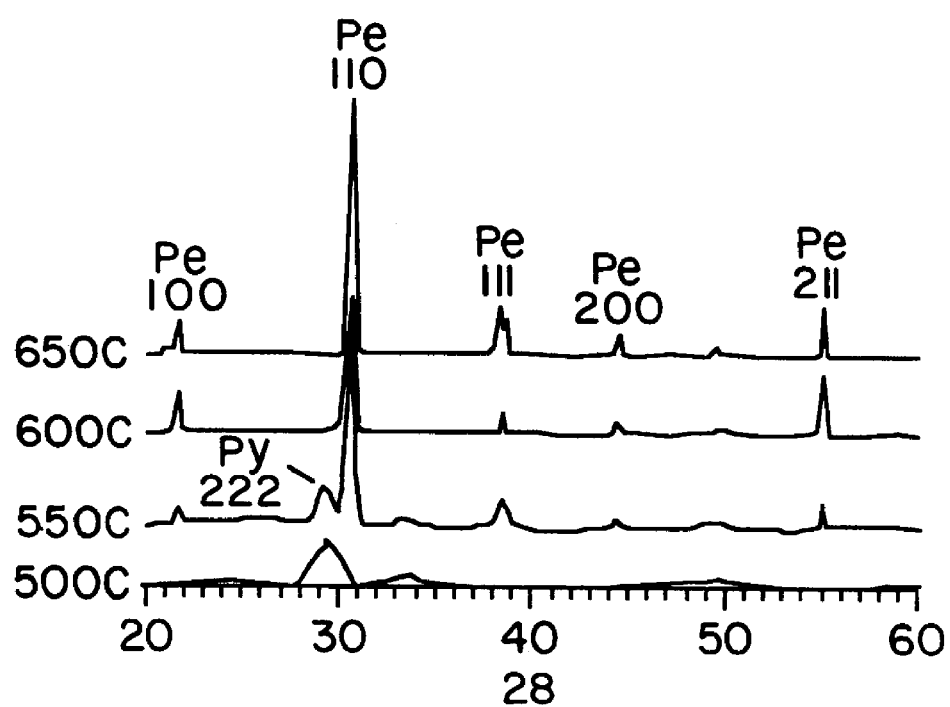
FIG. 2 is a graph of XRD patterns of unseeded 53/47 PZT films annealed at various temperatures.

FIG. 2 shows the x-ray diffraction spectra of PZT 53/47 films annealed from 500° C. to 650° C. for a fixed annealing time of 15 minutes. At 500° C., only the pyrochlore phase is found. At 550° C., both the perovskite phase and the pyrochlore phase is present. Thus, in this case, the $T_i^{per}$ is about 525° C. and the $T_c^{per}$ is 600° C. for the 53/47 PZT films.

Figure 3:
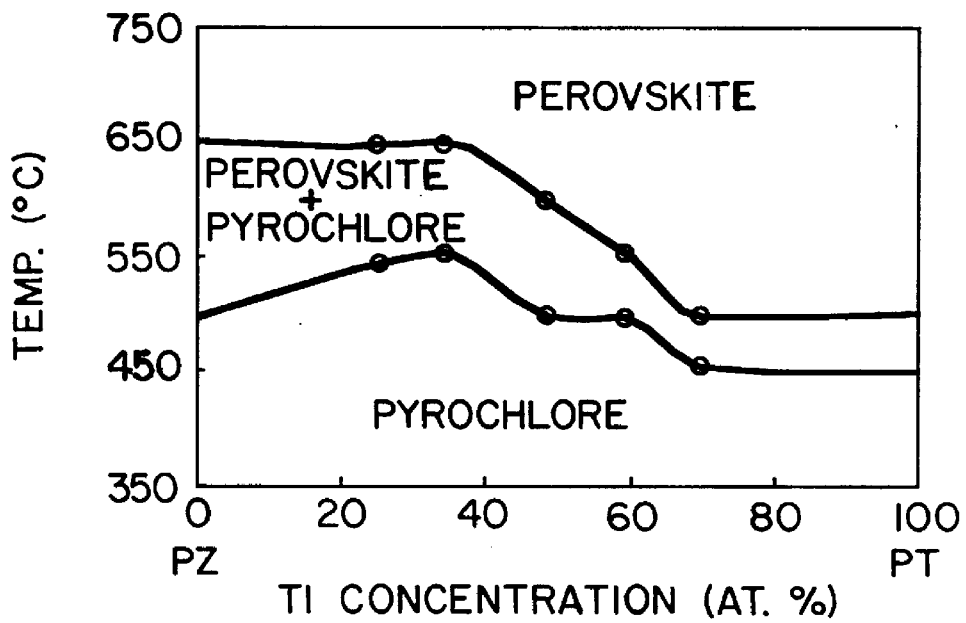
FIG. 3 is a graph of temperature versus Ti concentration percentage showing phases of perovskite, perovskite plus pyrochlore and pyrochlore phases.

Similar experiments have been performed on films with compositions ranging from pure lead titanate (PT) to pure lead zirconate (PZ); the results are summarized in FIG. 3. FIG. 3 illustrates the presence of the perovskite and pyrochlore phases as a function of annealing temperatures and compositions. The $T_i^{per}$ and $T_c^{per}$ of the Zr-rich phases are much higher than that of the Ti-rich phases. The $T_c^{per}$ of the PT film is 500° C., which is 100° C. lower than that of the 53/47 PZT film.

Figure 4:
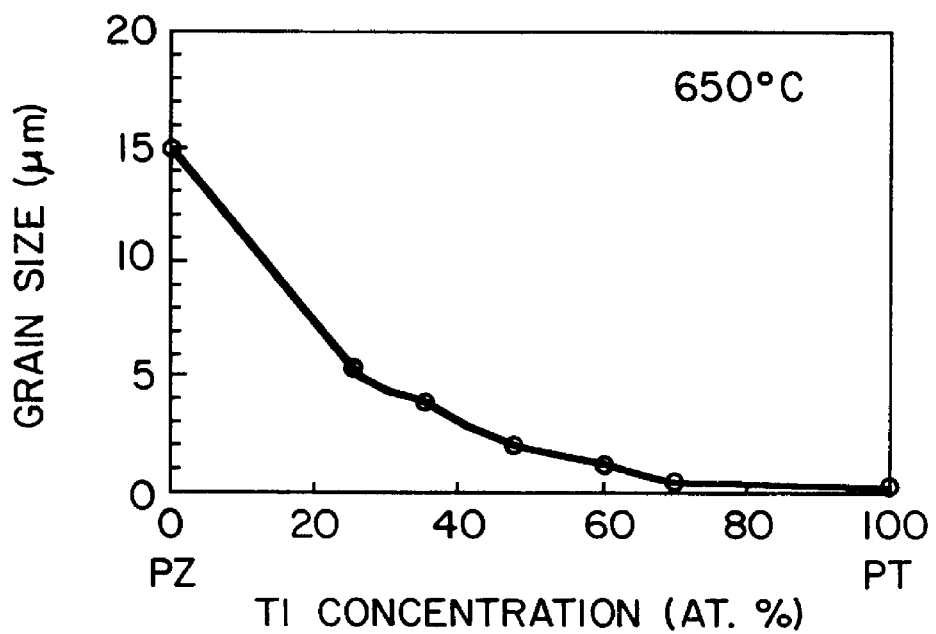
FIG. 4 is a graph of grain size versus Ti concentration.
Figure 5:
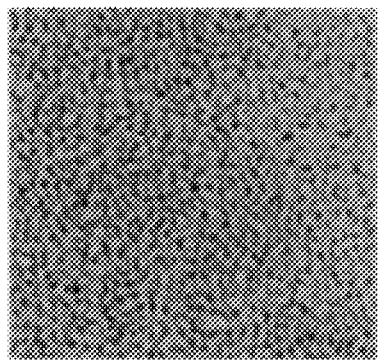
FIG. 5 is a micrograph of the perovskite phase in accordance with the present invention.
Figure 5B:
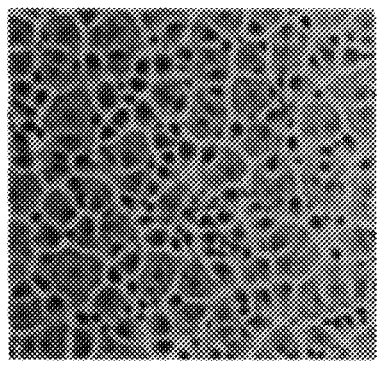
FIG. 5B is a micrograph of the perovskite phase in accordance with the present invention.
Figure 5D:
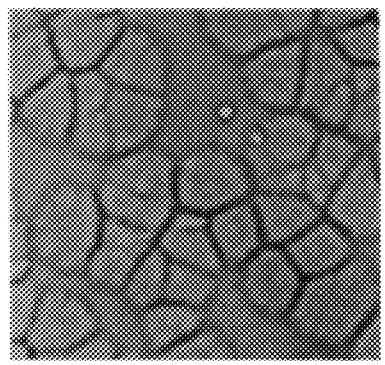
FIG. 5D is a micrograph of the perovskite phase in accordance with the present invention.
Figure 5A:
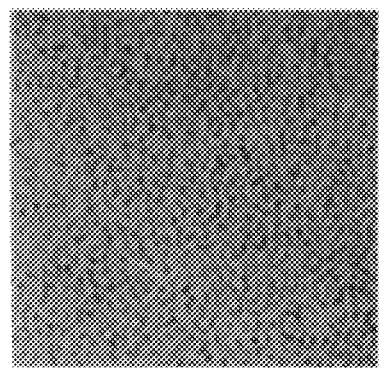
FIG. 5A is a micrograph of the perovskite phase in accordance with the present invention.
Figure 5C:
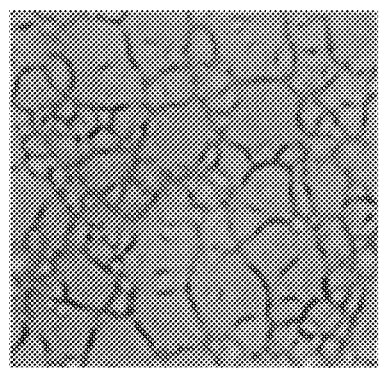
FIG. 5C is a micrograph of the perovskite phase in accordance with the present invention.
Figure 5E:
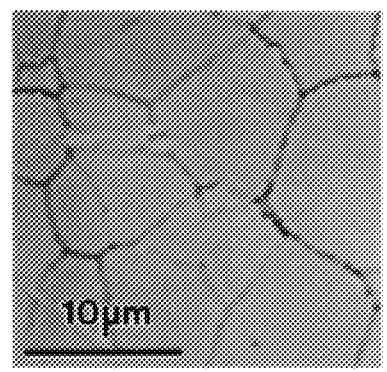
FIG. 5E is a micrograph of the perovskite phase in accordance with the present invention.

In addition to the notable variation of transformation temperatures as a function of composition, the microstructures of the perovskite phase of PZT films are greatly influenced by the composition (Zr/Ti ratio), as shown in FIG. 4. The grain sizes of the perovskite phase of the PZT films are plotted as a function of Ti concentrations. From pure PT to 30/70 PZT films, the grain size is very small (about 0.3 μm) and the grain size distribution is very small. From 40/60 to 65/35 PZT films, the grain size increases moderately and the grain size distribution has a much larger variation. From 75/25 PZT to PZ films, the grain size is much larger when compared to PZT films at lower Ti atomic concentrations. Also, for the Ti-rich PZT films (from PT to 30/70 films), the grain size is a weak function of annealing temperatures. In other words, once the formation of the perovskite phase is completed at or above $T_c^{per}$, the increase of grain size due to further annealing is almost indiscernible. In contrast, the grain sizes of the Zr-rich PZT films (from 65/35 to PZ films) rapidly increase as the annealing temperature increases. FIGS. 5, 5A, 5B, 5C, 5D and 5E show the grain structures of PZT films of different compositions. FIG. 4 is a 30/70 composition annealed at 550° C.; FIG. 5A is a 30/70 composition annealed at 700° C.; FIG. 5B is a 53/47 composition annealed at 650° C.; FIG. 5C is a 53/47 composition annealed at 700° C.; FIG. 5D is a 75/25 composition annealed at 650° C.; and FIG. 5E is a 75/25 composition annealed at 700° C. The Ti-rich phases have much smaller grain size when compared to those of the Zr-rich phases. The grain size distribution is much more uniform in the Ti-rich phases.

Based on these microstructural observations, it can be surmised that the Ti-rich phases should have lower nucleation barriers when compared to the Zr-rich phases. A lower nucleation barrier means more nuclei can form at a particular annealing temperature. In the case of Ti-rich phases, site saturation might have happened at $T_i^{per}$ when all the potential nucleation sites were consumed. Consequently, the grain size of the Ti-rich phases is determined only by the spacings between nuclei, and this would explain the small deviation of grain size distribution observed. On the other hand, in the case of Zr-rich phases, much fewer nuclei are formed at $T_i^{per}$, and most of the nuclei can grow into much larger grains. Nevertheless, higher transformation temperatures are required because the transformation is nucleation controlled. If the nucleation sites are randomly distributed and only a small number of the nuclei are present, it is very likely that there will be a large variation in grain size and that is what was observed in the Zr-rich samples.

For the first two steps of the three-step process of the present invention, PT was shown as the first deposited layer. Subsequently, 53/47 PZT films were deposited on top of the PT films and annealed at temperatures ranging from 450° C. to 600° in 25° C. intervals at a fixed annealing time of 15 minutes. These two-layer films are called PT-PZT films hereafter.

Figure 6:
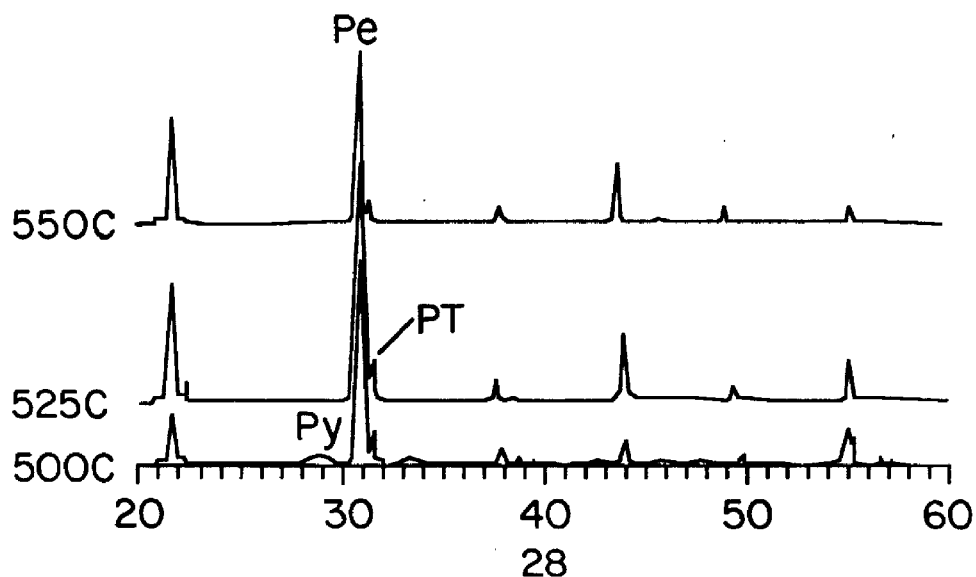
FIG. 6 is a plot of XRD patterns of seeded 53/47 PZT films annealed at various temperatures for 15 minutes.
Figure 7:
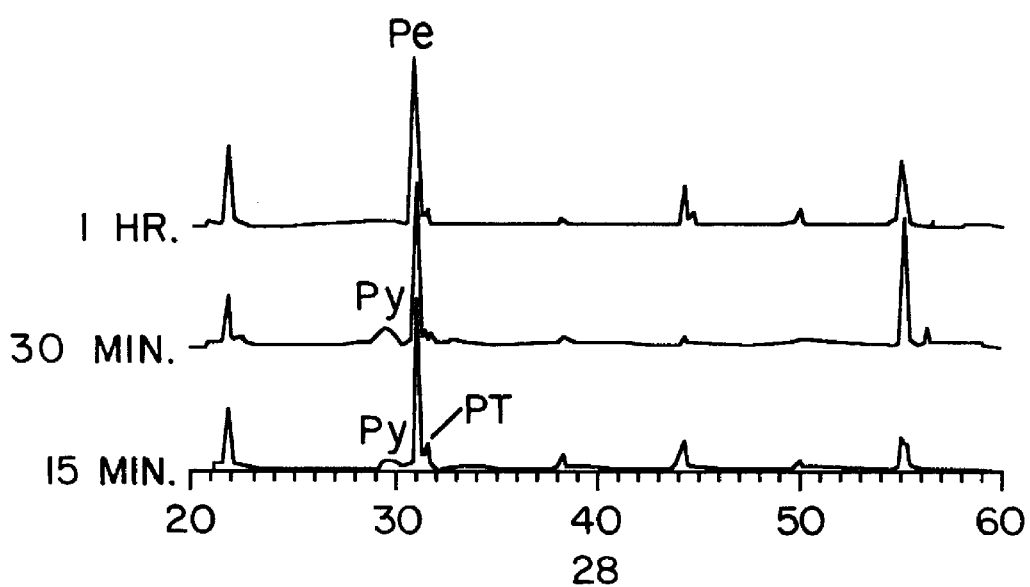
FIG. 7 is a plot of XRD patterns of seeded 53/47 PZT films annealed at 500° C. for various times.

The results of $T_c^{per}$ as a function of annealing temperature and time are summarized in the XRD photos of FIGS. 6 and 7. FIG. 6 denotes that a fixed annealing time of 15 minutes, the $T_c^{per}$ of the PT-PZT film is 525° C. As the annealing time is increased to 1 hour, the $T_c^{per}$ is further decreased to 500° C., as seen in the 500° C. graphs of FIG. 7. Hence, the transformation temperature of the 53/47 PZT films is decreased by 100° C. due to the presence of the seeding layer.

In the PZT thin film system, previous work has shown that nucleation is the rate-limiting step and therefore, the lowering of $T_c^{per}$ by the first two steps of the three-step process is most likely to be related to the lowering of nucleation activation energy of the perovskite formation. The two energy barriers that oppose nucleation are the strain energy and the surface energy that occur during transformation. However, the strain energy should not change whether or not the PZT film is formed in the presence of a PT seeding layer. Thus, the major effect of the first two steps of the three-step process is the decrease of surface energy, which, in turn, increases the kinetics of the nucleation.

The lowering of the surface energy can be explained by the lattice matchings of the PZT/PT and PZT/sapphire interfaces. Both the PT and the 54/47 PZT phases have a tetragonal "perovskite" structure. The lattice parameters, a and c, of the PT and the 53/47 PZT structures are 0.3899 and 0.4036 nm, and 0.4153 and 0.4146 nm, respectively. The sapphire substrate has a rhombohedral structure but is commonly represented by a hexagonal unit cell. The lattice parameters, a and c, are 0.4758 and 1.2991 nm (Powder Diffraction File, Inorganic Phase, JCPDS (International Center for Diffraction Data, Swarthmore, Pa., 1986), #6-452, #33-784, and #10-173). For the PZT/PT interface, the lattice mismatch in the a direction is about 3.4% and less than 0.2% in the c direction. For the PZT/sapphire interface, there are no common matching planes. If the lattice mismatch is small, the interface could be coherent or semicoherent. Either a coherent or semicoherent interface will have a much lower surface energy when compared to an incoherent interface. It is plausible that a seeding layer, which has a crystal structure similar to that of the deposited film and has a small lattice mismatch, can provide the preferred nucleation sites and thus increase the formation kinetics of the deposited film.

Figure 8:
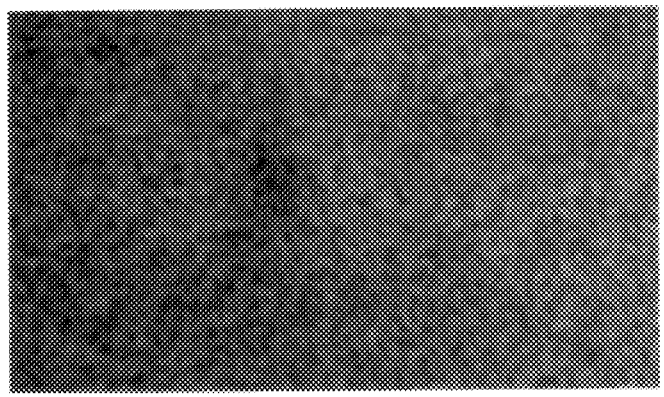
FIG. 8 is a micrograph of unseeded $PbTiO_3$ films annealed at 650° C.
Figure 8A:
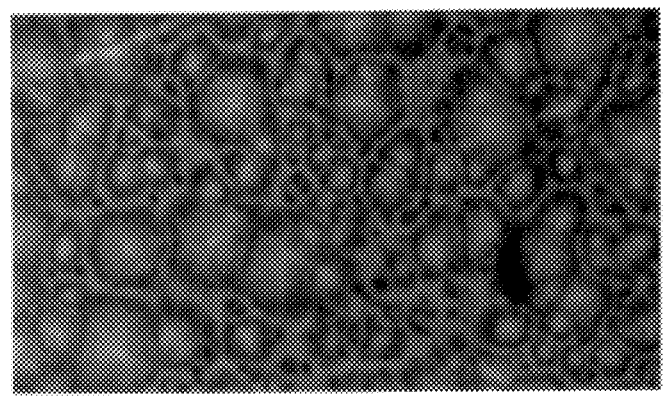
FIG. 8A is a micrograph of unseeded 53/47 PZT film annealed at 650° C.
Figure 8B:
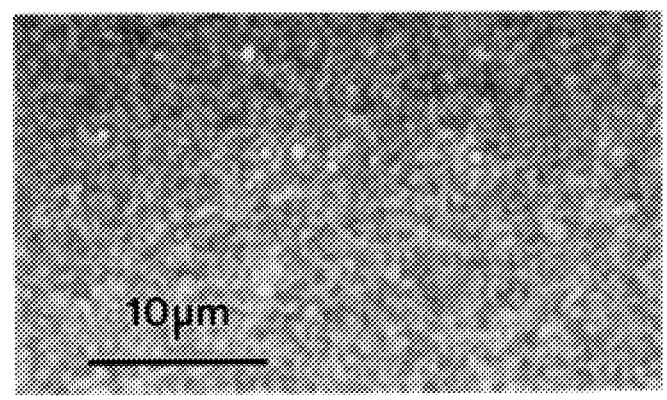
FIG. 8B is a micrograph of seeded 53/47 PZT film annealed at 650° C.

FIGS. 8, 8A and 8B show a comparison of the grain sizes between the 53/47 PZT films with (FIG. 7B) and without (FIG. 8 for PbTiO$_3$ and FIG. 8A for PZT) the seeding layer after they were annealed at the same temperature of 650° C. The grain size of the 53/47 film without the seeding layer is about 3.0 μm and is an order of magnitude larger than the grain size of the film with the seeding layer. In fact, the grain size of the PT-PZT films is very close to the grain size of the PT seeding film. This observation suggests that the seeding layer provides a large number of nucleation sites for the formation of the perovskite phase. Since the transformation rate is nucleation controlled, the grain size of the PT-PZT film is limited only by the distance that the perovskite phase can grow before the grains impinge on each other. Further grain growth by Oswald ripening is a very slow process, especially in the form of a two-dimensional thin film, due to the effects of thermal grooving (S. Desu, C. Peng, L. Kammerdiner, and P. Schuele, in Ferroelectric Thin Films, edited by E. R. Myers and A. I. Kingon (Mater. Res. Soc. Symp. Proc. 200, Pittsburgh, Pa., 1990), p. 319).

What is claimed is:

1. A process for producing a ferroelectric perovskite lead zirconate titanate film on a substrate, comprising: applying a lead titanate film to said substrate to produce a seeding layer on the substrate; and applying a lead zirconate titanate film over the said seeding layer; and applying a thin lead oxide layer over the said lead zirconate titanate film.

2. The method of claim 1, the said lead zirconate titanate film has a composition of Pb(Zr$_x$Ti$_{1-x}$)O$_3$ wherein x ranges from about 0.3 to about 0.75.

3. The method of claim 1, further comprising annealing the substrate with the applied lead titanate film, lead zirconate titanate film, and lead oxide film at an annealing temperature of 500° to 700° C.

4. The method of claim 1, wherein the lead zirconate titanate is approximately 53 mole % lead zirconate and 47 mole % lead titanate.

5. The method of claim 1, wherein the substrate with the applied lead titanate film, lead zirconate titanate film and lead oxide film is annealed at an annealing temperature of less than 600° C.

6. The method of claim 1, wherein the substrate with the applied lead titanate film, lead zirconate titanate film, and lead oxide film is annealed at an annealing temperature of less than 550° C.

7. The method of claim 1, further comprising annealing the lead titanate film before applying the lead zirconate titanate film.

8. The method of claim 7, wherein the lead titanate film is annealed at an annealing temperature of 450° C. to 550° C.

* * * * *